(12) United States Patent
Weinrich et al.

(10) Patent No.: US 6,593,228 B2
(45) Date of Patent: Jul. 15, 2003

(54) METHOD OF FABRICATING A PATTERNED METAL-CONTAINING LAYER ON A SEMICONDUCTOR WAFER

(75) Inventors: Volker Weinrich, Paris (FR); Gerhard Beitel, Kamakura (JP); Andreas Hauser, Schrobenhausen (DE); Peter Bosk, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/122,936

(22) Filed: Apr. 12, 2002

(65) Prior Publication Data
US 2002/0160596 A1 Oct. 31, 2002

(30) Foreign Application Priority Data
Apr. 12, 2001 (DE) .......................... 101 18 422

(51) Int. Cl.[7] .......................................... H01L 21/4763
(52) U.S. Cl. ..................... 438/633; 438/650; 438/653; 438/669
(58) Field of Search ................ 438/631, 633, 438/634, 650, 653, 669, 688

(56) References Cited

U.S. PATENT DOCUMENTS

| | | | |
|---|---|---|---|
| 5,677,239 A | * 10/1997 | Isobe | 438/633 |
| 5,858,870 A | 1/1999 | Zheng et al. | 438/622 |
| 6,143,638 A | * 11/2000 | Bohr | 438/612 |
| 6,207,554 B1 | * 3/2001 | Xu et al. | 438/624 |
| 6,291,891 B1 | * 9/2001 | Higashi et al. | 257/774 |
| 6,355,979 B2 | * 3/2002 | Tesauro et al. | 257/732 |
| 6,376,379 B1 | * 4/2002 | Quek et al. | 438/692 |

FOREIGN PATENT DOCUMENTS

| | | |
|---|---|---|
| DE | 197 33 391 A1 | 4/1999 |
| WO | WO 00/77841 A1 | 12/2000 |

* cited by examiner

Primary Examiner—T. N. Quach
(74) Attorney, Agent, or Firm—Laurence A. Greenberg; Werner H. Stemer; Ralph E. Locher

(57) ABSTRACT

A metal-containing layer is formed on a substrate. A mask layer is formed on the metal-containing layer. The mask layer is patterned by way of a lithographically fabricated mask. The metal-containing layer is patterned with the patterned mask layer, to thereby form an electrode out of the metal-containing layer. A protective layer is deposited on the mask layer and on the substrate. The protective layer undergoes chemical mechanical polishing, during which the protective layer is removed and the electrode is uncovered.

11 Claims, 2 Drawing Sheets

METHOD OF FABRICATING A PATTERNED METAL-CONTAINING LAYER ON A SEMICONDUCTOR WAFER

BACKGROUND OF THE INVENTION

Field of the Invention

The invention lies in the semiconductor technology field. More specifically, the invention pertains to a method for fabricating a patterned metal-containing layer on a semiconductor wafer.

Various methods for patterning metal-containing layers, such as for example a platinum layer, are known. For the purpose, a platinum layer that is provided on a semiconductor component is patterned by way of a mask which contains silicon oxide. A selectivity between platinum and silicon oxide of more than 0.6:1 is typically achieved. The etching of the platinum layer by means of the etching mask which contains silicon oxide may be carried out, for example, at temperatures of around approximately 300° C. However, the prior art does not disclose any suitable method which could allow the silicon oxide mask used for patterning the platinum layer to be removed from the patterned platinum layer. This is particularly difficult because there is a silicon oxide layer arranged underneath and laterally adjoining the patterned platinum electrode.

Consequently, removal of the silicon-oxide-containing etching mask would lead to undesirable removal of material from the silicon oxide layer arranged beneath and laterally next to the platinum layer, which could, for example, result in undercut etching of the platinum electrode.

By way of example, the silicon oxide layer could be removed selectively with respect to the platinum electrode with a dry or a wet etching step. A further possibility consists in using a doped silicate glass, such as for example PSG (phospho-silicate glass) or BSG (borosilicate glass). The doped silicate glasses can be etched selectively with respect to a silicon oxide layer arranged beneath the platinum layer, for example with hydrofluoric acid. However, the use of a doped silicate glass brings with it the drawback that this glass has a lower etching selectivity during the patterning of the platinum layer. Furthermore, a semiconductor fabrication installation for depositing a doped silicate glass is relatively expensive.

It has furthermore become known that a silicon nitride mask can be used instead of an etching mask which contains silicon oxide in order to pattern the platinum layer. However, the silicon nitride mask has the serious drawback of having very low etching selectivity during patterning of the platinum layer using standard chlorine-containing gases.

It is also known that organic films that are applied by means of spin-on methods can be used as an etching mask for the patterning of a platinum layer. That process is described, for example, in the commonly assigned, copending application Ser. No. 09/128,389, and published German patent application DE 197 33 391 A1. It is a drawback of that solution that the etching methods using organic etching masks to pattern the platinum layer are relatively expensive.

SUMMARY OF THE INVENTION

It is accordingly an object of the invention to provide a method of fabricating a structured metal-containing layer on a semiconductor wafer, which overcomes the above-mentioned disadvantages of the heretofore-known devices and methods of this general type and which provides for an improved method for patterning a metal-containing layer which is particularly suitable for protecting a ferroelectric, applied in a subsequent process step, from hydrogen diffusion.

With the foregoing and other objects in view there is provided, in accordance with the invention, a method of fabricating a patterned metal-containing layer on a semiconductor wafer, which comprises the following steps:
providing a substrate;
forming a metal-containing layer on the substrate;
forming a mask layer on the metal-containing layer;
patterning the mask layer with a lithographically fabricated mask to form a patterned mask layer;
patterning the metal-containing layer, which contains platinum, with the patterned mask layer to form an electrode;
depositing a protective layer, containing silicon nitride, on the patterned mask layer and on the substrate; and
chemically-mechanically polishing the protective layer and the patterned mask layer, to thereby remove the protective layer and the patterned mask layer from the metal-containing layer and thereby uncovering the metal-containing layer, or the electrode.

The method according to the invention for the patterning of a metal-containing layer has the advantage over the prior art that the mask layer used to pattern the metal-containing layer is removed by means of chemical mechanical polishing (CMP). The electrode is advantageously uncovered by the CMP step, so that a layer which is subsequently applied can be applied directly to the electrode. By way of example, the protective layer which is deposited prior to the CMP step is arranged on the electrode and laterally adjoining the electrode. After the CMP step, the protective layer remains laterally next to the electrode, where it can fulfill further functions: for example, the protective layer is suitable for acting as a diffusion barrier to oxygen. Furthermore, the protective layer can reduce the diffusion of hydrogen.

In accordance with an added mode of the inventive method, a barrier layer is applied to the substrate prior to the application of the electrode. The barrier layer advantageously serves as a diffusion barrier for oxygen or metals which could diffuse from the electrode into the contact.

In accordance with an additional mode of the novel method, the following steps are defined:
the barrier layer is patterned by means of an etching mask;
the protective layer is deposited on the etching mask, the barrier layer and the substrate;
the protective layer and the etching mask are removed from the barrier layer by means of chemical mechanical polishing and the barrier layer is uncovered, so that the barrier is laterally encapsulated by the protective layer; and
the electrode is then deposited on the barrier layer and the protective layer.

In this way, the barrier layer of the electrode and the laterally arranged protective layer is protected from the etchant used in isotropic etching.

In accordance with another feature of the invention, a planarization layer is deposited on the protective layer prior to the chemical mechanical polishing. The planarization layer is advantageously suitable for filling up the depressions and ditches in the protective layer and mechanically stabilizing the protective layer, so that mechanical defects are avoided during the subsequent CMP step.

In accordance with a further feature of the method according to the invention a contact, on which the electrode is formed, is arranged in the substrate. By way of example, the contact is suitable for making electrical contact with the electrode formed from the metal-containing layer.

Furthermore, according to the invention, there is provision for the barrier layer to contain titanium or titanium nitride or tantalum or tantalum nitride or tantalum silicon nitride or iridium or iridium oxide. Said materials are advantageously suitable for use as a barrier layer.

A further configuration of the method according to the invention provides for an insulation layer to be formed on the electrode, the insulation layer comprising a ferroelectric material. A ferroelectric material advantageously allows a ferroelectric memory cell to be formed.

A further method step provides for the substrate to contain silicon oxide or for the contact to contain polycrystalline silicon or for the mask layer to contain silicon oxide or for the planarization layer to contain silicon oxide. Said materials are advantageously suitable for forming the corresponding layers.

In accordance with a concomitant feature of the invention, the mask layer has a surface which is remote from the substrate and a side wall which is arranged perpendicular to the surface of the substrate, the protective layer is applied by way of targeted deposition, so that the protective layer is preferentially deposited on the surface of the substrate and on the surface of the mask layer and is deposited in a reduced thickness on the side wall of the mask layer.

Other features which are considered as characteristic for the invention are set forth in the appended claims.

Although the invention is illustrated and described herein as embodied in a method for fabricating a patterned metal-containing layer on a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
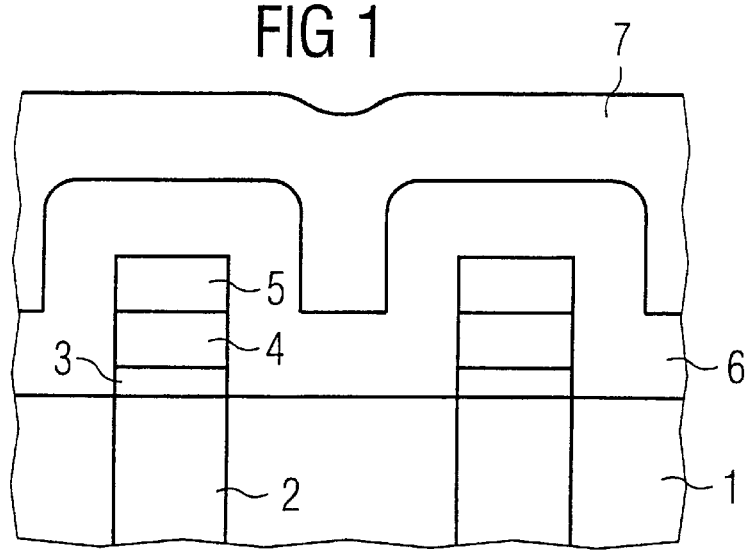
FIG. 1 is a diagrammatic side view of a substrate with a metal-containing layer and a mask layer.

Referring now to the figures of the drawing in detail and first, particularly, to FIG. 1 thereof, there is shown a substrate 1 and an electrical contact 2 disposed in the substrate 1. The substrate 1 comprises, by way of example, silicon oxide. The contact 2 comprises, by way of example, polycrystalline silicon, which may be doped with boron, arsenic, or phosphorous. A barrier layer 3 is arranged on the contact 2 and the substrate 1. The barrier layer 3 consists, for example, of a layer stack beginning at the contact with a tantalum silicon nitride layer, continuing with a tantalum nitride layer, an iridium layer and an iridium oxide layer arranged thereon. By way of example, the barrier layer 3 encompasses a height of 250 nm, while the tantalum nitride layer is 25 nm thick, the tantalum silicon nitride layer is 25 nm thick, the iridium oxide layer is 100 nm thick and the iridium layer is likewise 100 nm thick. A metal-containing layer 4, forming an electrode 4, is arranged on the barrier layer 3. The electrode 4 contains, by way of example, platinum. A mask layer 5 is arranged on the electrode 4. The mask layer 5 consists, for example, of silicon oxide and is suitable for patterning the metal-containing layer 4 and, if appropriate, also the barrier layer 3. This patterning has already taken place in FIG. 1. A protective layer 6 is arranged on the mask layer 5 and on the substrate 1. The protective layer 6 contains, for example, silicon nitride. In the exemplary embodiment illustrated in FIG. 1, the protective layer 6 is, for example, deposited conformally. However, it is also possible for the protective layer 6 to be applied by targeted deposition, so that the protective layer 6 is arranged on the substrate 1 and on the mask layer 5, but is not present or is only present to a small extent laterally on the mask layer 5. A planarization layer 7 is arranged on the protective layer 6. The planarization layer 7 contains, for example, a doped silicate glass, so that the planarization layer 7 is suitable for leveling the surface of the protective layer 6.

A method for fabricating the arrangement illustrated in FIG. 1 provides, for example, a substrate 1 which contains the contact 2. Then, the barrier layer 3 is applied to the entire surface of the contact 2 and the substrate 1. The metal-containing layer 4 is deposited on the barrier layer 3. The mask layer 5 is arranged on the metal-containing layer 4 and is patterned by way of photolithographic processing.

The metal-containing layer 4 is formed, for example, with a thickness of approximately 200 nm. The thickness of the mask layer 5 for etching of the barrier layer 3 is approximately 500 nm and for etching of the stack comprising the barrier layer and electrode is approximately 1 μm.

By way of example, a photolithographically exposed and developed resist mask is used to pattern the mask layer 5. By way of example, the resist mask may be fabricated from MID-UV photoresist with a thickness of 1.1 μm. For a 6-inch wafer substrate, the oxide layer can be patterned using a gas flow of 17 sccm (standard cubic centimeters per minute) of in each case $CHF_3$ and $CF_4$, and a gas flow of 80 sccm of argon, at a pressure of 70 millitorr (mTorr), under a magnetic field of 30 gauss, with 700 W being introduced in an MxP+ (Centura®) plasma etching unit, by means of the resist mask. For overetching, an etching process which is selective with respect to the metal-containing layer 4, which consists of platinum, during which process 45 sccm of $CF_4$ and 103 sccm of argon under a pressure of 200 millitorr and a magnetic field of 30 gauss are established, with 500 W being introduced. Then, the photoresist mask is removed by means of ashing and/or a wet-chemical cleaning step.

Then, a plasma etching process is used to etch the metal-containing layer 4 at an elevated temperature of between 280° C. and 350° C., and optionally at temperatures of over 350° C., allowing an increased etching rate, with partial coverage by means of the mask layer 5. By way of example, this etching may be carried out in an Applied Materials hot cathode DPS chamber at a cathode temperature of 325° C. and a chlorine to argon flow ratio of 4:1 at a pressure of 20 millitorr. The source power used is approximately 900 W, and a bias power injection is approximately 275 W. The etching is carried out over a period of approximately 140 seconds. In this case, overetching for the residue-free removal of platinum is already included within this time. After the etching, a mask layer 5 which is approximately 200 nm thick remains. The mask layer 5 has, for example, rounded portions at corners. After the etching, a rinse in purified water and a cleaning step using N-methylpyrrolidone at a temperature of 70° C. are carried out. Then, the protective layer 6 is deposited with a thickness that approximately corresponds to the thickness of the metal-containing layer 4. In this exemplary embodiment, the protective layer 6 is deposited as a silicon nitride layer which is approximately 200 nm thick by means of a PECVD (Plasma Enhanced Chemical Vapor Deposition) process. This can be carried out, for example, using an Applied Materials P5000 CVD installation with a D×Z chamber. The deposition carried out is, for example, conformal deposition, resulting in complete encapsulation of the electrode 4.

Instead of the PECVD deposition, which is typically carried out at temperatures between 350° C. and 450° C., it is also possible to deposit a thin film of silicon nitride by means of a LPCVD (low-pressure chemical vapor deposition) method. The LPCVD deposition is usually carried out at temperatures between 650° C. and 800° C.

To achieve good planarization during the subsequent CMP step, first of all a 500 nm thick planarization layer is deposited by means of a CVD process, with tetraethyl orthosilicate as starting gas by means of a PECVD process. A HDPCVD (High Density Plasma Chemical Vapor Deposition) process is suitable for planarization of trenches with a high aspect ratio, which occurs, for example, with relatively thick electrodes 4.

A further process variant for fabrication of the arrangement illustrated in FIG. 1 provides for the barrier layer 3 to be deposited over the entire surface and patterned and then for the metal-containing layer 4 to be deposited over the entire surface and patterned by means of the mask layer 5. In this case, a lower mask thickness of approximately 500 nm starting thickness is sufficient.

Figure 2:
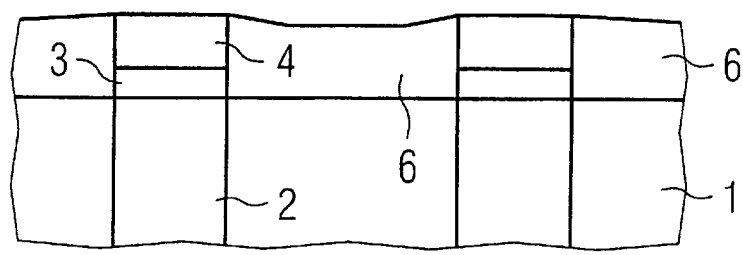
FIG. 2 is a similar view of the structure of FIG. 1 after a chemical mechanical polishing step has been carried out.

FIG. 2 illustrates the configuration known from FIG. 1, after a CMP (Chemical Mechanical Polishing) step has been carried out. For instance, a standard appliance produced by Westech 272 can be used for this purpose. By way of example, the model RodelJC1000 is a suitable polishing pad. An oxide abrasive paste produced by Clariant of type Kleboso130N50 can be used, for example, as the abrasive paste. During a CMP step of this type, the planarization layer 7 comprising silicon oxide is removed approximately twice as quickly as the protective layer 6 comprising silicon nitride. To operate the CMP installation, by way of example a pressure of 55158 Pa (8 psi), with a polishing-agent flow rate of 140 ml per minute and a back-surface pressure of 0 to 34474 Pa (0 to 5 psi) is used. The abrasive plate rotates at a speed of approximately 60 revolutions per minute, and the wafer holder, for its part, likewise rotates at a rate of approximately 60 revolutions per minute. After the CMP step, a cleaning step using deionized water is carried out in a cleaning installation produced by Ontrack. The CMP step described above has a silicon oxide removal rate of approx. 400 nm per minute. The nitride removal rate is approximately 250 nm per minute. For the mask layer 5 to be completely removed from the electrode 4, over-polishing is carried out. This leads to dishing in the protective layer 6 which is arranged next to the electrode 4. The result of the CMP step is an electrode 4 which is laterally encapsulated by silicon nitride. Below this is the patterned barrier 3, which is likewise protected by the silicon nitride.

Figure 3:
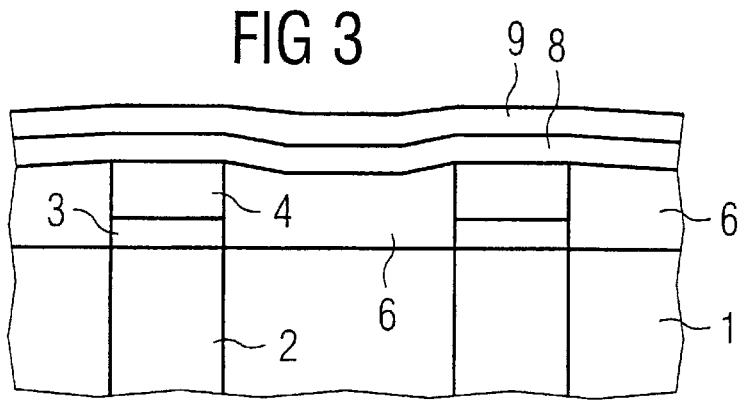
FIG. 3 is a similar view of the structure of FIG. 2, wherein an insulation layer and a further electrode have been deposited.

FIG. 3 illustrates the structure which is known from FIG. 2. In addition, an insulation layer 8 is arranged on the electrode 4 and the protective layer 6. A further electrode 9 is arranged on the insulation layer 8. The insulation layer 8 and the further electrode 9 are deposited, for example, over the entire surface and are then patterned in regions, as can be used for a common plate concept. The insulation layer 8 consists, for example, of SBT (Strontium Bismuth Tantalate) or PZT (Lead Zirconium Tantalate). The SBT layer may, for example, be crystallized in an oxygen-containing atmosphere.

The lateral encapsulation of the electrode 4 and of the barrier layer 3 by means of the protective layer 6 protects the contact 2 during the crystallization of the insulation layer 8, which is carried out under an oxygen atmosphere. In addition, during subsequent processing the protective layer 6 can serve as a barrier layer for hydrogen, in order to protect the insulation layer 8 from hydrogen which could diffuse out of the substrate 1 to the insulation layer 8.

Figure 4:
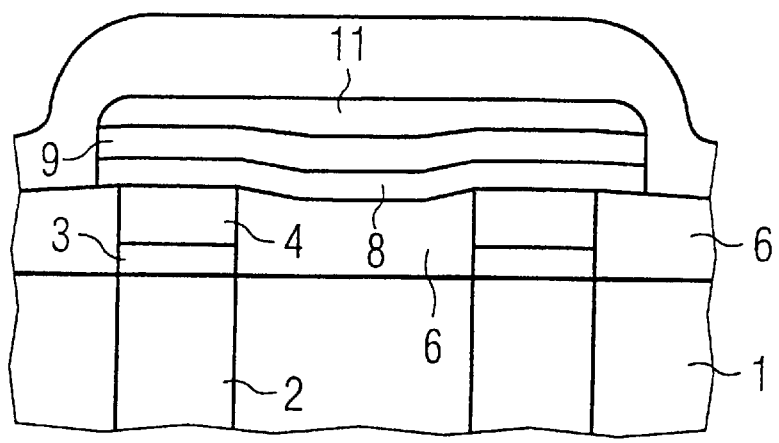
FIG. 4 is a side view illustrating a variation of the method represented in FIG. 3.

Referring now to FIG. 4, the further mask layer 11 has been used to pattern the further electrode 9 and the insulation layer 8. Then, in this exemplary embodiment, a further conformal protective layer 10 has been deposited on the further mask layer 11 and the protective layer 6. The upper electrode 9 can be used for a wide range of lower electrodes 4 as a common counterelectrode.

Figure 5:
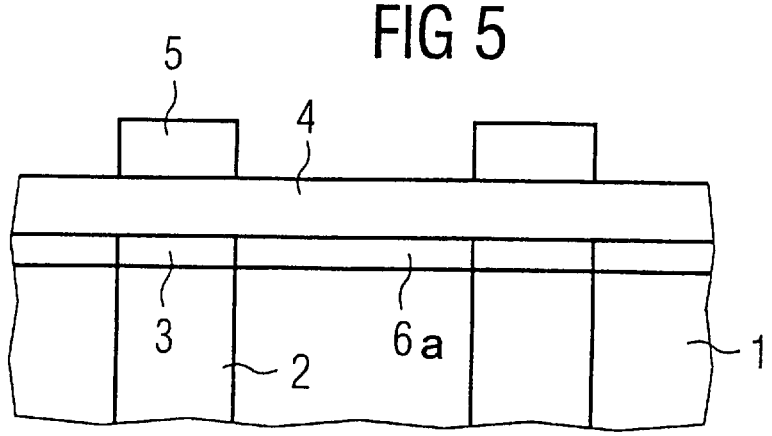
FIG. 5 is a diagrammatic view of a further exemplary embodiment for patterning a metal-containing layer.

FIG. 5 shows a further exemplary embodiment having a substrate 1 and a contact 2 arranged in the substrate 1. A barrier layer 3 is arranged on the contact 2. To fabricate the barrier layer 3, first of all the barrier layer 3 is deposited on the contact and the substrate 1 over the entire surface. Then, the barrier layer 3 is patterned by means of a mask. A protective layer 6a is deposited on the mask and that surface of the substrate 1 which has been uncovered during patterning of the barrier layer 3. Then, the protective layer 6a and the mask layer are planarized in such a way that the barrier layer 3 is uncovered at one surface. The barrier layer 3 is laterally surrounded by the protective layer 6a. Then, a metal-containing layer 4 is deposited on the barrier layer 3 and the protective layer 6a. A mask layer 5 is formed on the metal-containing layer 4 and is used to pattern the metal-containing layer 4 to form an electrode 4. The barrier layer 3 is encapsulated by the protective layer 6a.

Figure 6:
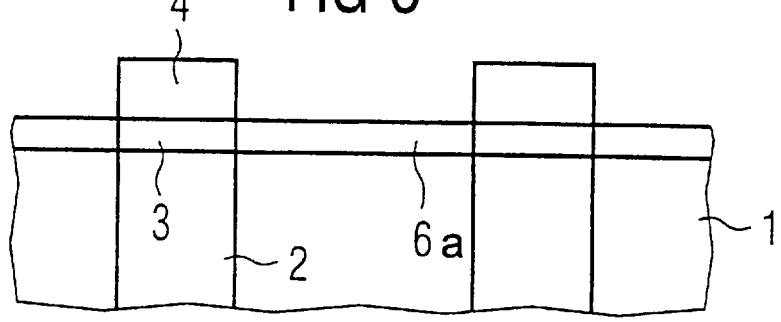
FIG. 6 is a diagrammatic view showing a further exemplary embodiment for patterning a metal-containing layer.

Referring now to FIG. 6, the patterning has been carried out. If the protective layer 6a is formed, for example, from silicon nitride and the mask layer 5 is formed, for example, from silicon oxide, the mask layer 5 can be removed from the patterned electrode 4 by wet-chemical means using hydrofluoric acid. The protective layer 6a thereby serves as selective etching protection during the removal of the mask layer 5. In this exemplary embodiment, the entire surface of the lower electrode is available as capacitor area.

We claim:

1. A method of fabricating a patterned metal-containing layer on a semiconductor wafer, which comprises the following steps:

providing a substrate;
depositing a metal-containing layer above the substrate;
forming a mask layer on the metal-containing layer;
patterning the mask layer with a lithographically fabricated mask to form a patterned mask layer;
patterning the metal-containing layer, which contains platinum, with the patterned mask layer;

depositing a protective layer, containing silicon nitride, on the patterned mask layer; and chemically-mechanically polishing the protective layer and the patterned mask layer, to thereby remove the protective layer and the patterned mask layer from the metal-containing layer and thereby uncovering the metal-containing layer.

2. The method according to claim 1, wherein the metal-containing layer containing platinum is patterned to form an electrode on the substrate.

3. The method according to claim 2, which comprises forming an insulation layer comprising a ferroelectric material on the electrode.

4. The method according to claim 1, which comprises applying a barrier layer to the substrate prior to depositing the metal-containing layer.

5. The method according to claim 4, wherein at least one material selected from the group consisting of titanium, titanium nitride, tantalum, tantalum nitride, tantalum silicon nitride, iridium, and iridium oxide is contained in the barrier layer.

6. The method according to claim 1, which comprises depositing a planarization layer on the protective layer prior to the chemical mechanical polishing step.

7. The method according to claim 6, wherein at least one of the following is true: the substrate contains silicon oxide, the contact contains poly-crystalline silicon, the mask layer contains silicon oxide, and the planarization layer contains silicon oxide.

8. The method according to claim 1, wherein a contact is formed in the substrate, and the metal-containing layer is formed into an electrode above the contact in the substrate.

9. The method according to claim 1, wherein at least one of the following is true: the substrate contains silicon oxide, the contact contains poly-crystalline silicon, and the mask layer contains silicon oxide.

10. The method according to claim 1, wherein the mask layer has a surface remote from the substrate and a side wall substantially perpendicular to a surface of the substrate, and which comprises depositing the protective layer by targeted deposition, such that the protective layer is preferentially deposited on the surface of the substrate and on the surface of the mask layer and is deposited at a lesser thickness on the side wall of the mask layer.

11. A method of fabricating a patterned metal-containing layer on a semiconductor wafer, which comprises the following steps:

providing a substrate with a surface;

applying a barrier layer to the surface of the substrate;

patterning the barrier layer with an etching mask for removing at least a portion of the barrier layer to uncover the surface of the substrate resulting in an uncovered substrate surface;

depositing a protective layer, containing silicon nitride, on the etching mask and on the uncovered substrate surface;

removing at least the protective layer from a surface of the barrier layer by chemical mechanical polishing resulting in the barrier layer being laterally encapsulated by the protective layer;

depositing a metal-containing layer on the barrier layer and the protective layer;

forming a mask layer on the metal-containing layer; and patterning the mask layer with a lithographically fabricated mask to pattern the metal-containing layer to form an electrode.

* * * * *